(12) United States Patent
Ohashi

(10) Patent No.: US 6,251,472 B1
(45) Date of Patent: *Jun. 26, 2001

(54) METHOD OF DEPOSITING ELECTRODE MATERIAL ONTO A PIEZOELECTRIC SUBSTRATE WHEREBY THE SUBSTRATE IS MASKED AND THE UNMASKED PORTIONS ARE CLEANED BY A PLASMA OR ION BEAM PRIOR TO DEPOSITION

(75) Inventor: Kunimi Ohashi, Tochigi-ken (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/318,516

(22) Filed: Oct. 5, 1994

Related U.S. Application Data

(63) Continuation of application No. 08/058,432, filed on Apr. 27, 1993, now abandoned, which is a continuation of application No. 07/819,639, filed on Jan. 10, 1992, now abandoned, which is a continuation of application No. 07/524,019, filed on May 15, 1990, now abandoned.

(30) Foreign Application Priority Data

May 18, 1989 (JP) .................................... 1-125932

(51) Int. Cl.[7] .............. B05D 3/14; B05D 5/12; C23C 14/02
(52) U.S. Cl. .......... 427/100; 427/526; 427/576; 427/535; 427/552; 427/250; 427/282; 427/327; 310/312
(58) Field of Search .................... 427/524, 526, 427/576, 100, 250, 282; 310/123; 429/25.35; 417/535, 552, 327

(56) References Cited

U.S. PATENT DOCUMENTS

| | | | |
|---|---|---|---|
| 3,363,119 | * 1/1968 | Koneval et al. | 310/312 |
| 3,832,761 | * 9/1974 | Sheahan et al. | 29/25.35 |
| 3,864,161 | * 2/1975 | Thompson | 117/212 |
| 4,406,059 | * 9/1983 | Scott et al. | 29/857 |
| 4,450,374 | * 5/1984 | Cho et al. | 29/25.35 |
| 4,466,874 | * 8/1984 | Belke, Jr. et al. | 204/192 EC |
| 4,627,379 | * 12/1986 | Roberts et al. | 427/100 |
| 4,853,579 | * 8/1989 | Kawasaki et al. | 310/116 |
| 4,886,587 | * 12/1989 | Miyawaki | 204/130 |

OTHER PUBLICATIONS

CRC Handbook of Chemistry and Physics 1982 p. P–190, P–191.*

* cited by examiner

*Primary Examiner*—Timothy Meeks
*Assistant Examiner*—Michael Barr
(74) *Attorney, Agent, or Firm*—Fitzpatrick, Cella, Harper & Scinto

(57) ABSTRACT

In a method for forming the electrode pattern of a piezoelectric element for an ultrasonic motor, metal pattern masks made of a metal material of a low expansion coefficient are disposed on the surfaces of piezoelectric elements for the ultrasonic motor, and the electrode patterns are formed on the surfaces of the piezoelectric elements through the metal pattern masks by means of a vacuum evaporation device which is equipped with a physical assistance device for rendering physical assistance with ion beams or ion plating.

4 Claims, 2 Drawing Sheets

1

METHOD OF DEPOSITING ELECTRODE MATERIAL ONTO A PIEZOELECTRIC SUBSTRATE WHEREBY THE SUBSTRATE IS MASKED AND THE UNMASKED PORTIONS ARE CLEANED BY A PLASMA OR ION BEAM PRIOR TO DEPOSITION

The present application is a continuation of application Ser. No. 08/058,432 filed Apr. 27, 1993, now abandoned which is a continuation of Ser. No. 07/819,639 filed Jan. 10, 1992, now abandoned which is a continuation of Ser. No. 07/524,019 filed May 15, 1990 which is now abandoned.

BACKGROUND OF THE INVENTION

1. Field of the Invention

This invention relates to a method for forming the electrode pattern of a piezoelectric element for a ultrasonic motor employed as an ultrasonic wave source in the driving system of a camera or a copy machine.

2. Description of the Related Art

The electrode pattern of a piezoelectric element used for an ultrasonic motor generally has a complex shape.

It is, therefore, inconceivable to form the electrode pattern for the ultrasonic motor through a single process. In a method which has heretofore been contrived, the electrode pattern is formed by applying an electrode film to the whole surface of the piezoelectric element either by a vacuum evaporation or sputtering process; and, after that, the electrode surface is patternized by photo-etching.

The method for forming the electrode pattern which has heretofore been contrived thus necessitates photo-etching. However, it requires many processes, thus necessitating much time, labor and an increased cost.

SUMMARY OF THE INVENTION

This invention is directed to the solution of the above-stated problem. It is, therefore, an object of the invention to provide a method of forming the electrode pattern of a piezoelectric element for an ultrasonic motor in a plurality of pattern shapes solely by means of a vacuum evaporation device through a single process.

It is another object of the invention to provide a method of forming the electrode pattern of a piezoelectric element for an ultrasonic motor with the number of electrode pattern forming processes and the processing time thereof reduced to a great degree by excluding a photo-etching process.

These and other objects and features of this invention will become apparent from the following detailed description of embodiments thereof taken in connection with the accompanying drawings.

DETAILED DESCRIPTION OF THE PREFERRED EMBODIMENTS

The following describes embodiments of this invention with reference to the accompanying drawings. First, a method whereby an electrode pattern is formed with the assistance of ion beams according to this invention is described as a first embodiment of the invention.

Figure 1:
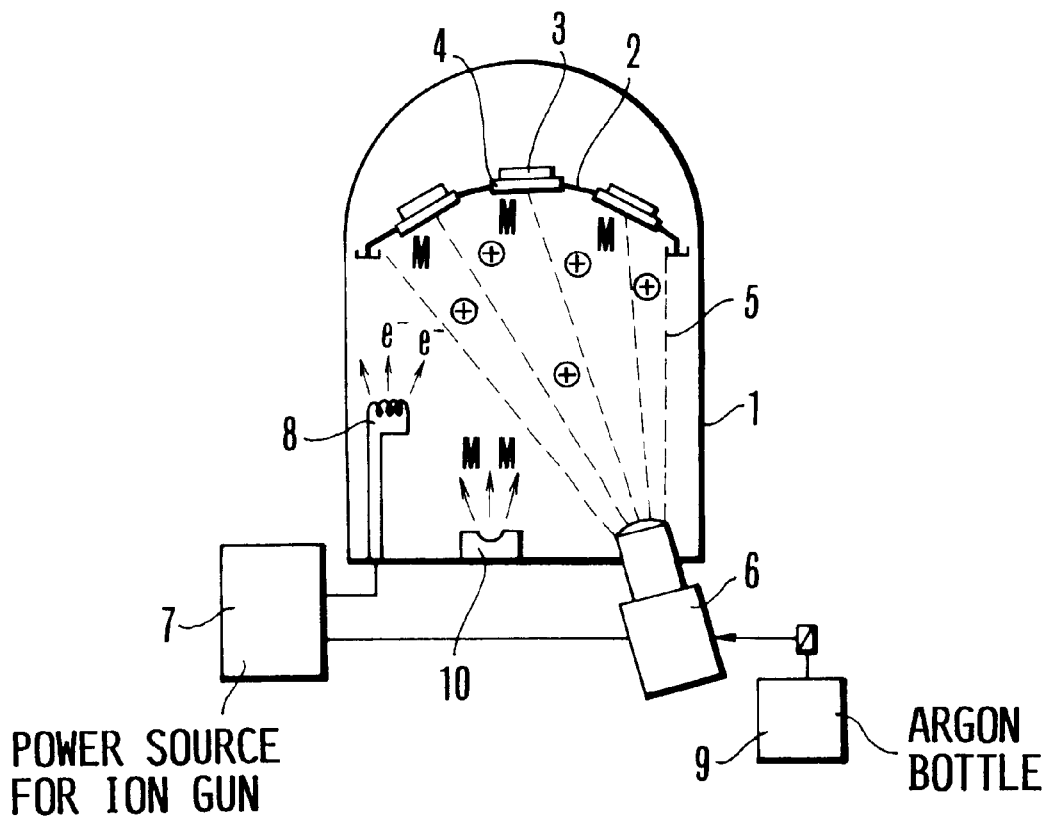
FIG. 1 shows the arrangement of a vacuum evaporation device which is provided with an ion beam device and is arranged according to this invention as a first embodiment thereof.
Figure 2A:
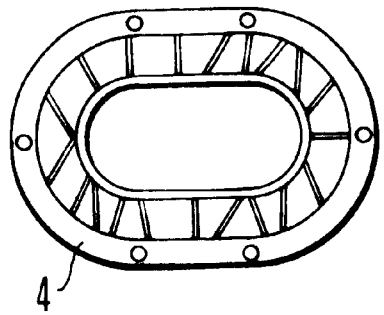
FIG. 2(a) is a plan view showing a pattern mask used for the vacuum evaporation device of FIG. 1.
Figure 2B:
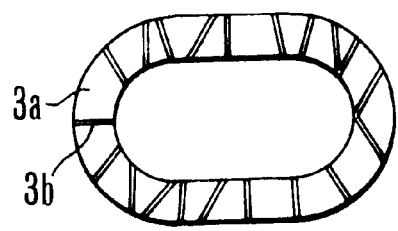
FIG. 2(b) shows an electrode pattern formed on a piezoelectric element shown in FIG. 1.

FIG. 1 shows a vacuum evaporation device which is provided with an ion beam device. Referring to FIG. 1, a deposition umbrella 2 is disposed within a film forming chamber 1. A plurality (three, for example) of pattern masks 4 on which piezoelectric elements 3 are to be mounted are arranged on the front side as viewed on the drawing. The surface of each of the pattern masks 4 has a pattern which permits formation of electrode parts 3a and insulating parts 3b in different shapes as shown in FIG. 2(b). The pattern masks 4 are made of a metal material of a low coefficient of expansion. An ion gun 6 is arranged to irradiate the piezoelectric elements 3 with ion beams 5 through the pattern masks 4 for the purpose of cleaning. The illustration includes a power source for the ion gun 6 and a neutralizer 8. An argon bottle 9 is provided for argon ion irradiation in the form of the ion beams 5 from the ion gun 6. An electron gun 10 is provided for forming nickel electrodes on the surface of the piezoelectric element as shown in FIG. 2(b).

The device which is arranged as described above forms the electrode pattern in the following manner:

The piezoelectric element 3 has been thoroughly washed beforehand with an ultrasonic washer. After the washing, the element 3 is set on each of the pattern masks 4 which are incorporated in the deposition umbrella 2. In this instance, the surface roughness provides a spacing between the piezoelectric element 3 and the pattern mask 4 that is preferably not exceeding 0.01 mm. Electrode forming conditions are as follows: An exhaust system which is not shown is first operated to discharge air from the inside of the film forming chamber 1 to a degree of vacuum of $1 \times 10^{-5}$ torrs. Following that, the ion beams 5 are applied to clean the piezoelectric element 3 by argon gas ion irradiation. A preferred amount of the argon gas to be used for this purpose is between 3 and 5 SCCM. To ensure a good cleaning effect, the cleaning is performed preferably for a period of time between 5 and 10 minutes. After the cleaning nickel electrodes of mechanical film thickness of 0.5 to 1.0 $\mu$m are formed on the surface of the piezoelectric element 3 by means of the electron gun 10.

In this instance, it is necessary to have an ion accelerating energy of 1.0 to 1.2 keV as a physical assistance condition. Any degree of energy exceeding this value would cause the metal deposited on the surface of the piezoelectric element 3, that of the pattern mask and the metal material of the mask itself to be sputtered. Then, the sputtering molecules would enter between the piezoelectric element and the covering mask to cause inadequate insulation between electrode patterns.

In the following table 1, the quality of the workpiece of the electrode pattern obtained in accordance with this invention in the above-stated manner is compared with that of an electrode pattern obtained according to the conventional method:

TABLE 1

| Workpiece of: | Conventional method | Method of first embodiment |
|---|---|---|
| Adhesion of electrode: | 0.5–1.0 kg/mm² | 1.5–2.0 kg/mm² |
| Diffusion time of electrode: | 0.5–1.5 min | 4–4.5 min |
| Electric resistance of pattern: | 3–7 Ω/P | 0.5–1.5 Ω/P |
| P = 5 × 15 (longitudinally measured) | | |
| Insulation resistance between patterns: | At least 150 MΩ | At least 150 MΩ |

In Table 1 above, the "diffusion time of electrode" is measured as follows: A tin or lead alloy is melted on the electrode film. After that, temperature is kept at about 350° C. Under this condition, a period of time required for diffusion of the electrode film to the alloy is measured. The electrode film measures 1.0 μm in thickness and 5×5 mm in area.

Figure 3:
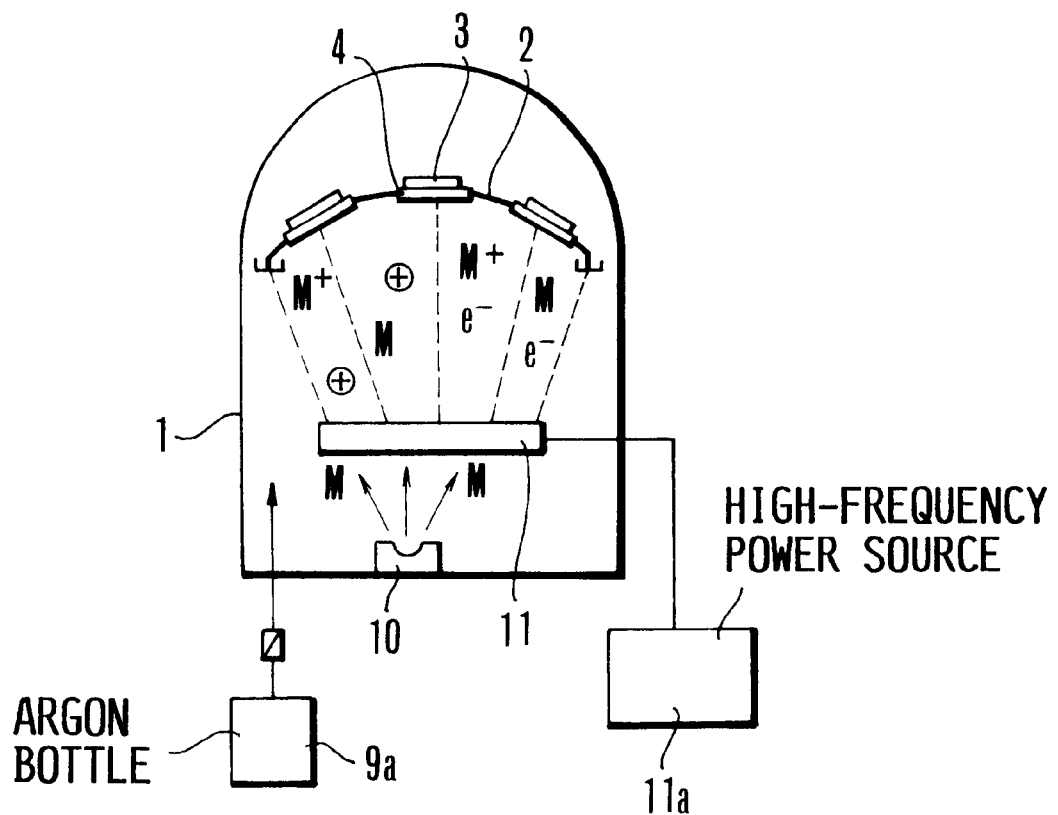
FIG. 3 shows a vacuum evaporation device which is provided with an ion plating device and is arranged as a second embodiment of the invention.

Next, a second embodiment of this invention is described as follows: In this case, an electrode pattern is formed with the assistance of ion plating. FIG. 3 shows a vacuum evaporation device which is provided with an ion plating device. In FIG. 3, the same parts as those of FIG. 1 are indicated by the same reference numerals and the details of them are omitted from the following description. A high-frequency output tube 11 is arranged to produce a high-frequency output for the purpose of cleaning. The high-frequency output produced by the high-frequency output tube 11 changes the inside of the film forming chamber 1 into a plasmatic state. A reference numeral 11a denotes a high-frequency power source. A numeral 9a denotes an argon gas bottle which is arranged to fill the inside of the film forming chamber 1 with argon gas.

With the device arranged as described above, the electrode pattern is formed in the following manner: The piezoelectric element 3 is thoroughly washed beforehand by means of an ultrasonic washer. Following that, the piezoelectric elements 3 are set on the pattern masks 4 which are incorporated in the deposition umbrella 2. The surface roughness provides spacing or gap between each piezoelectric element 3 and each pattern mask 4 that is preferably less than 0.01 mm. The electrodes are formed under the following conditions: The air inside the film forming chamber 1 is discharged to the degree of vacuum 1×10⁻⁵ torrs. Next, the piezoelectric element 3 is cleaned for about 10 min. by changing the inside of the film forming chamber 1 into a plasmatic state by means of the high-frequency output tube 11, preferably under a condition of 1 to 5×10⁻⁴ torrs in an argon gas atmosphere. The high-frequency output (13.56 MHz) is preferably at a value between 0.5 and 1.0 KW. After the cleaning, a nickel electrode film of mechanical film thickness, between 0.5 and 1.0 μm is formed on the surface of the piezoelectric element 3 by means of the electron gun 10. In this instance, the high-frequency output required for physical assistance is between 0.1 and 0.3 KW. Any high-frequency output value that exceeds this value is undesirable, because it would cause inadequate insulation between electrode patterns due to the high electric resistance of the electrode film, sputtering, etc.

A workpiece obtained in accordance with the method of the second embodiment described above is compared with that obtained according to the conventional method. Table 2 shows the result of comparison.

TABLE 2

| Workpiece of: | Conventional method | Method of second embodiment |
|---|---|---|
| Adhesion of electrode: | 0.5–1.0 kg/mm² | 1.0–1.5 kg/mm² |
| Diffusion time of electrode: | 0.5–1.5 min | 3–4.0 min |
| Electric resistance of pattern: | 3–7 Ω/P | 0.5–1.5 Ω/P |
| P = 5 × 15 (longitudinally measured) | | |
| Insulation resistance between patterns: | At least 150 MΩ | At least 150 MΩ |

In Table 2 above, the "diffusion time of electrode" is measured as follows: A tin or lead alloy is melted on the electrode film. After that, temperature is kept at about 350° C. Under this condition, a period of time required for diffusion of the electrode film to the alloy is measured. The electrode film measures 1.0 μm in thickness and 5×5 mm in area.

In accordance with this invention, as described in detail in the foregoing, the electrode pattern is formed on the surface of the piezoelectric element by the vacuum evaporation device which is equipped with the device for providing a physical assistance such as ion beams or ion plating or the like. The invented arrangement dispenses with the photo-etching process which has been indispensable according to the conventional method. Therefore, the number of the electrode pattern forming processes and the required processing time can be reduced to a great degree in accordance with the electrode pattern forming method of this invention.

What is claimed is:

1. A method for forming an electrode pattern on a piezoelectric element for an ultrasonic motor, the electrode pattern including a plurality of shapes of electrode portions for selectively energizing corresponding portions of the piezoelectric element, thereby generating an ultrasonic vibration wave in the ultrasonic motor, the ultrasonic vibration wave generating a frictional driving force for a driving system, said method using a single electrode forming step in a vacuum deposition device and comprising the steps of:

ultrasonic-washing a piezoelectric element with an ultrasonic washer;

setting the ultrasonic-washed piezoelectric element on a pattern mask which is incorporated in a deposition umbrella and is made of a metal material having a surface roughness providing a maximum spacing between the piezoelectric element and the pattern mask not exceeding 0.1 mm, the metal material having a thermal expansion characteristic which maintains the maximum spacing between the piezoelectric element and the pattern mask under vacuum deposition conditions, the deposition umbrella being disposed within a film forming chamber of the vacuum deposition device, the pattern mask having a pattern formed therein corresponding to the plurality of shapes of electrode portions of the electrode pattern;

discharging air from the interior of the film forming chamber to obtain a vacuum therein;

irradiating the piezoelectric element with ion beams through the pattern mask with an ion acceleration energy in a range from 1.0 to 1.2 KeV, thereby irradiation cleaning a portion of the piezoelectric element exposed through the pattern mask and corresponding to the plurality of shapes of electrode portions of the electrode pattern; and after said irradiating step, vapor depositing nickel through the pattern mask onto a surface of the irradiation cleaned portion of the piezoelectric element with an electron gun assisted by ion acceleration energy sufficient to form a nickel film having a final film thickness in a range of 0.5 to 1.0 $\mu$m and an adhesion strength between the nickel film and the surface of the piezoelectric element in a range of 1.5–2.0 kg/mm$^2$, the nickel film thereby forming a plurality of shapes of electrode portions corresponding to the pattern of the pattern mask and having insulating portions between the plurality of shapes of electrode portions.

2. A method for forming an electrode pattern on a piezoelectric element for an ultrasonic motor, the electrode pattern including a plurality of shapes of electrode portions for selectively energizing corresponding portions of the piezoelectric element, thereby generating an ultrasonic vibration wave in the ultrasonic motor, the ultrasonic vibration wave generating a frictional driving force for a driving system, said method using a single electrode forming step in a vacuum deposition device and comprising the steps of:

ultrasonic-washing a piezoelectric element with an ultrasonic washer;

setting the ultrasonic-washed piezoelectric element on a pattern mask which is incorporated in a deposition umbrella and is made of a metal material having a surface roughness providing a maximum spacing between the piezoelectric element and the pattern mask not exceeding 0.1 mm, the metal material having a thermal expansion characteristic which maintains the maximum spacing between the piezoelectric element and the pattern mask under vacuum deposition conditions, the deposition umbrella being disposed within a film forming chamber of the vacuum deposition device, the pattern mask having a pattern formed therein corresponding to the plurality of shapes of electrode portions of the electrode pattern;

discharging air from the interior of the film forming chamber to obtain a vacuum therein;

producing a frequency signal output in a range from 0.1 to 0.3 KW to produce a plasmatic state inside of the film forming chamber, thereby plasma cleaning a portion of the piezoelectric element exposed through the pattern mask and corresponding to the plurality of shapes of electrode portions of the electrode pattern; and after said producing step, vapor depositing nickel through the pattern mask onto a surface of the plasma cleaned portion of the piezoelectric element with an electron gun assisted by frequency signal output sufficient to form a nickel film having a final film thickness in a range of 0.5 to 1.0 $\mu$m and an adhesion strength between the nickel film and the surface of the piezoelectric element in a range of 1.0–1.5 kg/mm$^2$, the nickel film thereby forming a plurality of shapes of electrode portions corresponding to the pattern of the pattern mask and having insulating portions between the plurality of shapes of electrode portions.

3. A method of forming an electrode pattern on a piezoelectric element for an ultrasonic motor used as source of ultrasonic wave for a driving system by a single step in a vacuum deposition device, comprising the steps of:

ultrasonic-washing a piezoelectric element for an ultrasonic motor with an ultrasonic washer;

setting the ultrasonic washed piezoelectric element on a pattern mask which is incorporated in a deposition umbrella and is made of a metal material having a surface roughness providing a maximum spacing between the piezoelectric element and said pattern mask not exceeding 0.01 mm, said metal material having a thermal expansion characteristic which maintains the maximum spacing between the piezoelectric element and said pattern mask under vacuum evaporation conditions, said deposition umbrella being disposed within a film forming chamber of a vacuum evaporation device, said pattern mask having a pattern formed therein for forming a plurality of shapes of electrode portions on a surface of said piezoelectric element;

discharging air from the interior of said film forming chamber to obtain a vacuum therein;

irradiating said piezoelectric element with ion beams through said pattern mask with an ion acceleration energy in a range from 1.0 to 1.2 KeV, thereby irradiation cleaning a portion of said piezoelectric element exposed through said pattern mask; and after said irradiating step, forming an electrode pattern of a nickel film through said pattern mask on a surface of said piezoelectric element with an electron gun assisted by ion acceleration energy sufficient to form said nickel film with a final film thickness in the range of 0.5 to 1.0 $\mu$m and an adhesion strength between said electrode pattern of the nickel film and the surface of said piezoelectric element in the range of 1.5–2.0 kg/mm$^2$, the electrode pattern of the nickel film having a plurality of shapes of electrode portions corresponding to the pattern of the pattern mask and having insulating portions between the plurality of shapes of electrode portions.

4. A method of forming an electrode pattern on a piezoelectric element for an ultrasonic motor used as source of ultrasonic wave for a driving system by a single step in a vacuum deposition device, comprising the steps of:

ultrasonic-washing a piezoelectric element for an ultrasonic motor with an ultrasonic washer;

setting the ultrasonic-washed piezoelectric element on a pattern mask which is incorporated in a deposition umbrella and is made of a metal material having a surface roughness providing a maximum spacing between the piezoelectric element and said pattern mask not exceeding 0.01 mm, said metal material having a thermal expansion characteristic which maintains the maximum spacing between the piezoelectric element and said pattern mask under vacuum evapo ration conditions, said deposition umbrella being disposed within a film forming chamber of a vacuum evaporation device, said pattern mask having a pattern formed therein for forming a plurality of shapes of electrode portions on a surface of said piezoelectric element;

discharging air from the interior of said film forming chamber to obtain a vacuum therein;

producing a frequency signal output in a range from 0.1 to 0.3 KW to produce a plasmatic state inside of said film forming chamber, thereby plasma cleaning a portion of said piezoelectric element corresponding to the complimentary electrode pattern; and after said producing step, forming an electrode pattern of a nickel film through said pattern mask on a surface of said piezoelectric element with an electron gun assisted by frequency signal output sufficient to form said nickel film with a final film thickness in the range of 0.5 to 1.0 $\mu$m and an adhesion strength between said electrode pattern of the nickel film and the surface of said piezoelectric element in the range of 1.0–1.5 kg/mm$_2$, the electrode pattern of the nickel film having a plurality of shapes of electrode portions corresponding to the pattern of the pattern mask and having insulating portions between the plurality of electrode portions.

* * * * *

UNITED STATES PATENT AND TRADEMARK OFFICE
CERTIFICATE OF CORRECTION

PATENT NO. : 6,251,472 B1
DATED : June 26, 2001
INVENTOR(S) : Kunimi Ohashi

It is certified that error appears in the above-identified patent and that said Letters Patent is hereby corrected as shown below:

<u>Column 4,</u>
Line 61, "0.1mm," should read -- 0.01mm, --.

<u>Column 5,</u>
Line 41, "0.1mm," should read -- 0.01mm, --.

<u>Column 6,</u>
Line 67, "evapo" should read -- evapo- --.

<u>Column 7,</u>
Line 13, "complimentary" should read -- complementary --.

<u>Column 8,</u>
Line 7, "1.0-1.5 kg/mm$_2$," should read -- 1.0-1.5 kg/mm$^2$, --.

Signed and Sealed this

Fourteenth Day of May, 2002

*Attest:*

JAMES E. ROGAN
*Attesting Officer*  *Director of the United States Patent and Trademark Office*